(12) United States Patent
Nomura et al.

(10) Patent No.: US 10,027,250 B2
(45) Date of Patent: Jul. 17, 2018

(54) SEMICONDUCTOR DEVICE WITH POWER ELEMENTS AND CURRENT DETECTION PORTION

(71) Applicant: DENSO CORPORATION, Kariya, Aichi-pref. (JP)

(72) Inventors: Kousuke Nomura, Kariya (JP); Masaki Takashima, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/320,343

(22) PCT Filed: Jun. 26, 2015

(86) PCT No.: PCT/JP2015/003237
§ 371 (c)(1),
(2) Date: Dec. 20, 2016

(87) PCT Pub. No.: WO2016/002184
PCT Pub. Date: Jan. 7, 2016

(65) Prior Publication Data
US 2017/0155341 A1    Jun. 1, 2017

(30) Foreign Application Priority Data
Jul. 3, 2014    (JP) .................................. 2014-137865

(51) Int. Cl.
*H02M 7/53*    (2006.01)
*H02M 7/537*    (2006.01)
(Continued)

(52) U.S. Cl.
CPC ............. *H02M 7/537* (2013.01); *H02M 1/08* (2013.01); *H02M 7/003* (2013.01); *H02M 2001/0009* (2013.01)

(58) Field of Classification Search
CPC . H02M 1/08; H02M 7/003; H02M 2001/0009
See application file for complete search history.

(56) References Cited

U.S. PATENT DOCUMENTS 8,884,411 B2    11/2014    Kadoguchi et al.
2003/0184326 A1*    10/2003    Throngnumchai ..... H02M 1/32
                                                                        324/713
(Continued)

FOREIGN PATENT DOCUMENTS

JP    2006-140217 A       6/2006
JP    2006140217 A  *    6/2006
(Continued)

*Primary Examiner* — Yusef A Ahmed
(74) *Attorney, Agent, or Firm* — Posz Law Group, PLC

(57) ABSTRACT

A semiconductor device includes: power elements that configures an inverter; a conductive plate that electrically connects the power elements; and a current detection portion. The power elements include a first power element and a second power element. The conductive plate includes: a first carrying portion; a second carrying portion; a third carrying portion; a fourth carrying portion; a first connection portion that electrically connects the second carrying portion and the third carrying portion to connect the first power element and the second power element in series; and an output terminal electrically connected with the second carrying portion or the third carrying portion. The first carrying portion is connected with a first power source and the fourth carrying portion is connected with a second power source. The current detection portion is fixed to the output terminal and the magnetic field permeates the current detection portion.

5 Claims, 10 Drawing Sheets

(51) Int. Cl.
 *H02M 1/08* (2006.01)
 *H02M 7/00* (2006.01)
 *H02M 1/00* (2006.01)

(56) References Cited

U.S. PATENT DOCUMENTS

| | | | | |
|---|---|---|---|---|
| 2005/0161809 A1* | 7/2005 | Nakatsu | ................ | H02M 7/003 257/734 |
| 2009/0046489 A1* | 2/2009 | Yoshimura | ......... | H01F 17/0013 363/123 |
| 2009/0057832 A1* | 3/2009 | Kouno | ................ | H01L 29/7397 257/577 |
| 2011/0310585 A1* | 12/2011 | Suwa | ................... | H05K 7/1432 361/820 |
| 2012/0001308 A1* | 1/2012 | Fukutani | ........... | H01L 23/49524 257/675 |
| 2012/0063187 A1* | 3/2012 | Sato | .................... | H02M 3/3374 363/131 |
| 2013/0049137 A1* | 2/2013 | Uno | ...................... | H01L 27/088 257/401 |
| 2013/0075886 A1* | 3/2013 | Abe | ...................... | H02M 7/003 257/685 |
| 2013/0286617 A1* | 10/2013 | Shibasaki | ............. | H01L 23/049 361/772 |
| 2014/0035112 A1* | 2/2014 | Kadoguchi | ....... | H01L 23/49548 257/666 |
| 2014/0367736 A1* | 12/2014 | Iizuka | .................. | H01L 25/072 257/133 |
| 2014/0367739 A1* | 12/2014 | Muto | ................ | H01L 23/49551 257/146 |
| 2015/0214205 A1* | 7/2015 | Tokuyama | .............. | H01L 25/18 257/139 |
| 2016/0192495 A1* | 6/2016 | Nakamura | .......... | H01L 23/5227 361/783 |
| 2016/0218047 A1* | 7/2016 | Okumura | ................ | H01L 25/07 |
| 2016/0255714 A1* | 9/2016 | Hiramitsu | ............ | H02M 7/003 361/709 |
| 2016/0294379 A1* | 10/2016 | Hayashiguchi | ....... | H01L 25/072 |
| 2017/0040802 A1* | 2/2017 | Hopperdietzel | ..... | G01R 15/183 |
| 2017/0148770 A1* | 5/2017 | Ishino | ................... | H01L 25/072 |
| 2017/0229428 A1* | 8/2017 | Muto | ................... | H01L 25/072 |

FOREIGN PATENT DOCUMENTS

| | | |
|---|---|---|
| JP | 2009-049049 A | 3/2009 |
| JP | 2009049049 A * | 3/2009 |
| JP | 2013-149684 A | 8/2013 |

\* cited by examiner y DIRECTION
x DIRECTION y DIRECTION x DIRECTION

SEMICONDUCTOR DEVICE WITH POWER ELEMENTS AND CURRENT DETECTION PORTION

CROSS REFERENCE TO RELATED APPLICATIONS

The present application is a U.S. national stage of International Patent Application No. PCT/JP2015/003237 filed on Jun. 26, 2015 and is based on Japanese Patent Application No. 2014-137865 filed on Jul. 3, 2014, the disclosures of which are incorporated herein by reference.

TECHNICAL FILED

The present disclosure relates to a semiconductor device that includes multiple power elements, a conductive plate electrically connecting the multiple power elements, and a current detection portion that detects a current of the multiple power elements.

BACKGROUND ART

A motor driving device including an inverter and a current sensor is known as described in Patent Literature 1, for example. The inverter includes a U-phase arm, a V-phase arm, and a W-phase arm. These three arms are connected with a motor generator. Each of the three arms is connected in parallel between a power supply line and a ground line and has a uniform configuration.

The inventors of the present application have found the following. The U-phase arm described in Patent Literature 1 includes two non-type transistors, two spacers, a positive electrode plate, an electrode plate, an output electrode plate, a negative electrode plate, a conductor, and a current sensor. An emitter of the first non-type transistor is fixed to the positive electrode plate, while a collector of the first non-type transistor is fixed to the electrode plate via the first spacer. An emitter of the second non-type transistor is fixed to the output electrode plate, while a collector of the second non-type transistor is fixed to the negative electrode plate via the second spacer. The electrode plate and the output electrode plate are electrically connected with each other via the conductor. The current sensor is disposed in the vicinity of the conductor.

In the structure of the U-phase arm described herein, a current flows from the first non-type transistor to the output electrode plate via the conductor in an ON-state of the first non-type transistor and an OFF-state of the second non-type transistor. On the other hand, a current flows from the output electrode plate to the second non-type transistor without passing through the conductor in an OFF-state of the first non-type transistor and an ON-state of the second non-type transistor. In this case, the current flowing in the conductor does not correspond to the current input to and output from the two non-type transistors. In the structure in which the current sensor is disposed in the vicinity of the conductor, a magnetic field generated by a flow of a current in the conductor permeates the current sensor. In this condition, the current itself input to and output from the two non-type transistors (power elements) cannot be detected.

PRIOR ART LITERATURE

Patent Literature

Patent Literature 1: JP 2006-140217 A

SUMMARY OF INVENTION

It is an object of the present disclosure to provide a semiconductor device capable of detecting a current input to and output from two power elements.

According to one aspect of the present disclosure, a semiconductor device including: multiple power elements that configures an inverter; a conductive plate that electrically connects the plurality of power elements; and a current detection portion that detects a current of the plurality of power elements based on a magnetic field generated by a flow of a current input to the plurality of power elements and a current output from the plurality of power elements, is provided. The semiconductor device at least includes a first power element and a second power element as multiple power elements. The conductive plate includes: a first carrying portion to which a first end of the first power element is connected; a second carrying portion to which a first end of the second power element is connected; a third carrying portion to which a second end of the first power element is connected; a fourth carrying portion to which a second end of the second power element is connected; a first connection portion that electrically connects the second carrying portion and the third carrying portion to connect the first power element and the second power element in series; and an output terminal electrically connected with the second carrying portion or the third carrying portion. The first carrying portion is connected with a first power source and the fourth carrying portion is connected with a second power source. The current detection portion is fixed to the output terminal and the magnetic field generated by the flow of the current of the output terminal permeates the current detection portion.

According to this configuration, the first power element and the second power element are connected in series via the first connection portion. Accordingly, a current flows from the first power element to the output terminal via the first connection portion. Instead, a current flows from the output terminal to the second power element without passing through the first connection portion. In this case, the current flowing in the first connection portion does not correspond to the current input to and output from the two power elements. In the structure in which the current detection portion is fixed to the first connection portion, a magnetic field generated by a flow of a current of the first connection portion permeates the current detection portion. In this condition, the current input to and output from the two power elements is difficult to detect. On the other hand, according to the semiconductor device of the present disclosure, the current detection portion is fixed to the output terminal, and therefore a magnetic field generated by a flow of a current of the output terminal permeates the current detection portion. Accordingly, the current input to and output from the two power elements is detectable by using the current detection portion.

BRIEF DESCRIPTION OF DRAWINGS

The above and other objects, features, and advantages of the present disclosure will become more apparent from the following detailed description with reference to the accompanying drawings, in the drawings.

DESCRIPTION OF EMBODIMENTS

An embodiment of the present disclosure will be hereinafter described with reference to the drawings.

Figure 1:
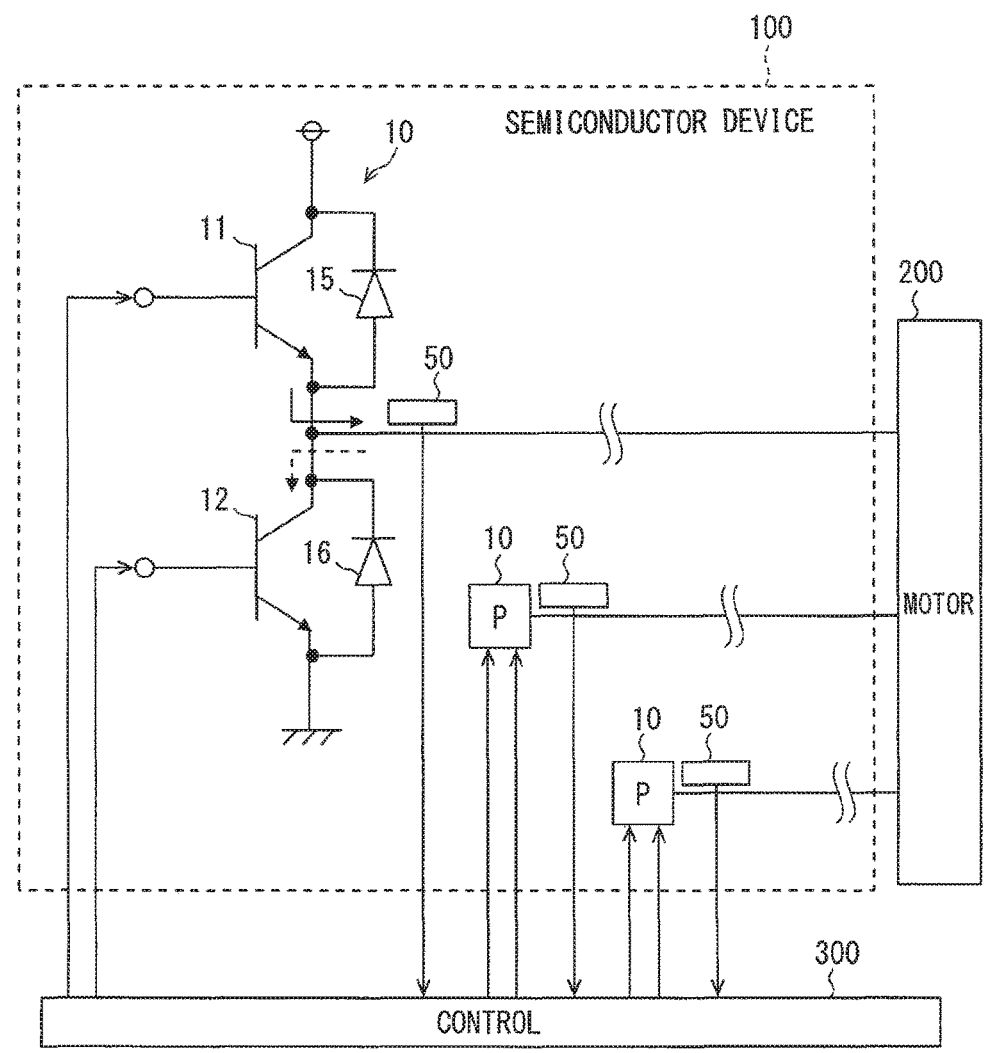
FIG. 1 is a circuit diagram illustrating an equivalent circuit of a semiconductor device.

A semiconductor device according to this embodiment will be described with reference to FIG. 1 to FIG. 6. FIG. 1 illustrates a three-phase motor 200 and a controller 300 as well as a semiconductor device 100. In FIG. 3, areas corresponding to connections of arm portions 41 to 43 (described below) are hatched to clarify these connections. In the following description, three orthogonal directions are defined as an x direction, a y direction, and a z direction.

Figure 2:
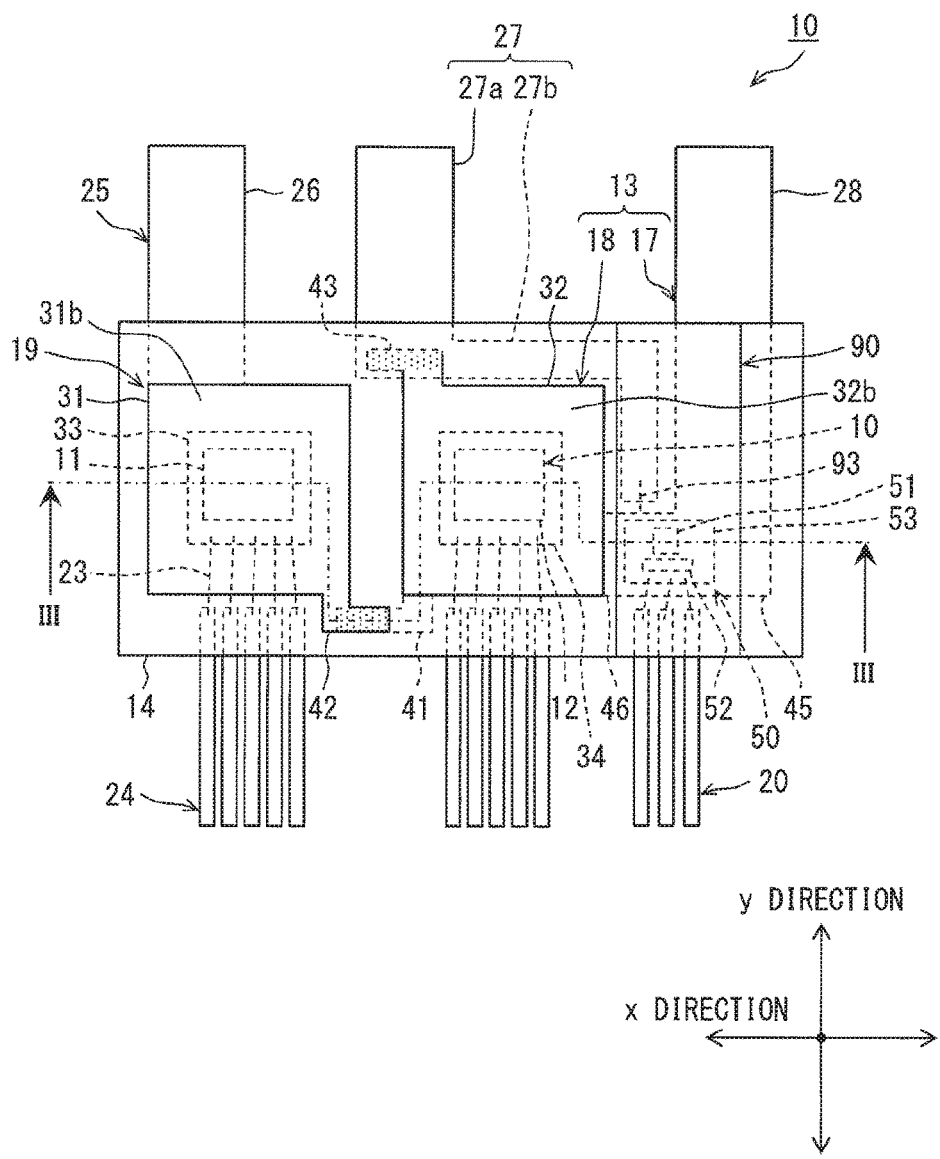
FIG. 2 is a top view illustrating general configurations of a power card and a current detection portion.
Figure 3:
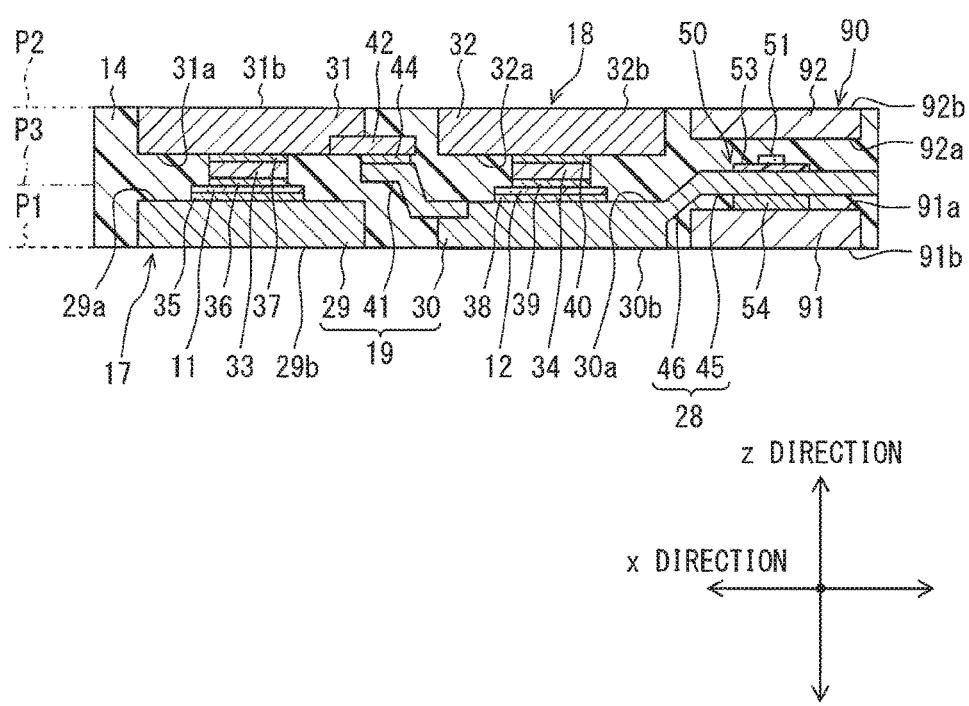
FIG. 3 is a sectional view taken along line in FIG. 2.

As illustrated in FIGS. 1 to 3, the semiconductor device 100 includes power cards 10 configuring an inverter, and current detection portions 50 for detecting electric currents of the power cards 10. As illustrated in FIG. 1, the semiconductor device 100 includes the three power cards 10. An inverter is configured by these three power cards 10. The three power cards 10 configuring the inverter are electrically connected with the three-phase motor 200. Driving of the power cards 10 is controlled by the controller 300. The semiconductor device 100 includes the current detection portions 50 each of which is provided for the corresponding one of the three power cards 10. Each of the current detection portions 50 detects a current flowing between the corresponding power card 10 and the three-phase motor 200.

Each of the foregoing three power cards 10 has a uniform configuration. Accordingly, FIG. 1 only illustrates an equivalent circuit of one of the three power cards 10. Each of the three power cards 10 includes power elements 11, 12, a conductive plate 13 electrically and mechanically connecting the power elements 11, 12, and a covering portion 14 for covering and protecting the power elements 11, 12 and the conductive plate 13, As illustrated in FIG. 1, the first power element 11 and the second power element 12 are connected with each other in series. The midpoint between the first power element 11 and the second power element 12 is electrically connected with the three-phase motor 200. Each of the power elements 11, 12 according to this embodiment is configured by IGBT. A collector electrode of the first power element 11 is connected with a power source, while an emitter electrode of the first power element 11 is connected with a collector electrode of the second power element 12. An emitter electrode of the second power element 12 is connected with the ground. The power elements 11. 12 are therefore connected in series in this order from the power source to the ground. The power source corresponds to a first power source, while the ground corresponds to a second power source. For example, in a driving state of the first power element 11 and a non-driving state of the second power element 12, a current flows from the first power element 11 to the three-phase motor 200 as indicated by a solid arrow in FIG. 1. On the other hand, in a non-driving state of the first power element 11 and a driving state of the second power element 12, a current flows from the three-phase motor 200 to the second power element 12 as indicated by a broken arrow in FIG. 1. As can be understood, a current flows from the power element 11 or 12 to the three-phase motor 200, or flows from the three-phase motor 200 to the power element 11 or 12 in accordance with changes of the driving states of the power elements 11, 12. As illustrated in FIG. 1, diodes 15, 16 are connected with the power elements 11, 12, respectively, in antiparallel connection. The respective diodes 15, 16 constitute parasitic diodes of the power elements 11, 12. The one power card 10, and the one current detection portion 50 associated with the one power card 10 will be hereinafter detailed with reference to FIGS. 2 to 6.

Figure 4:
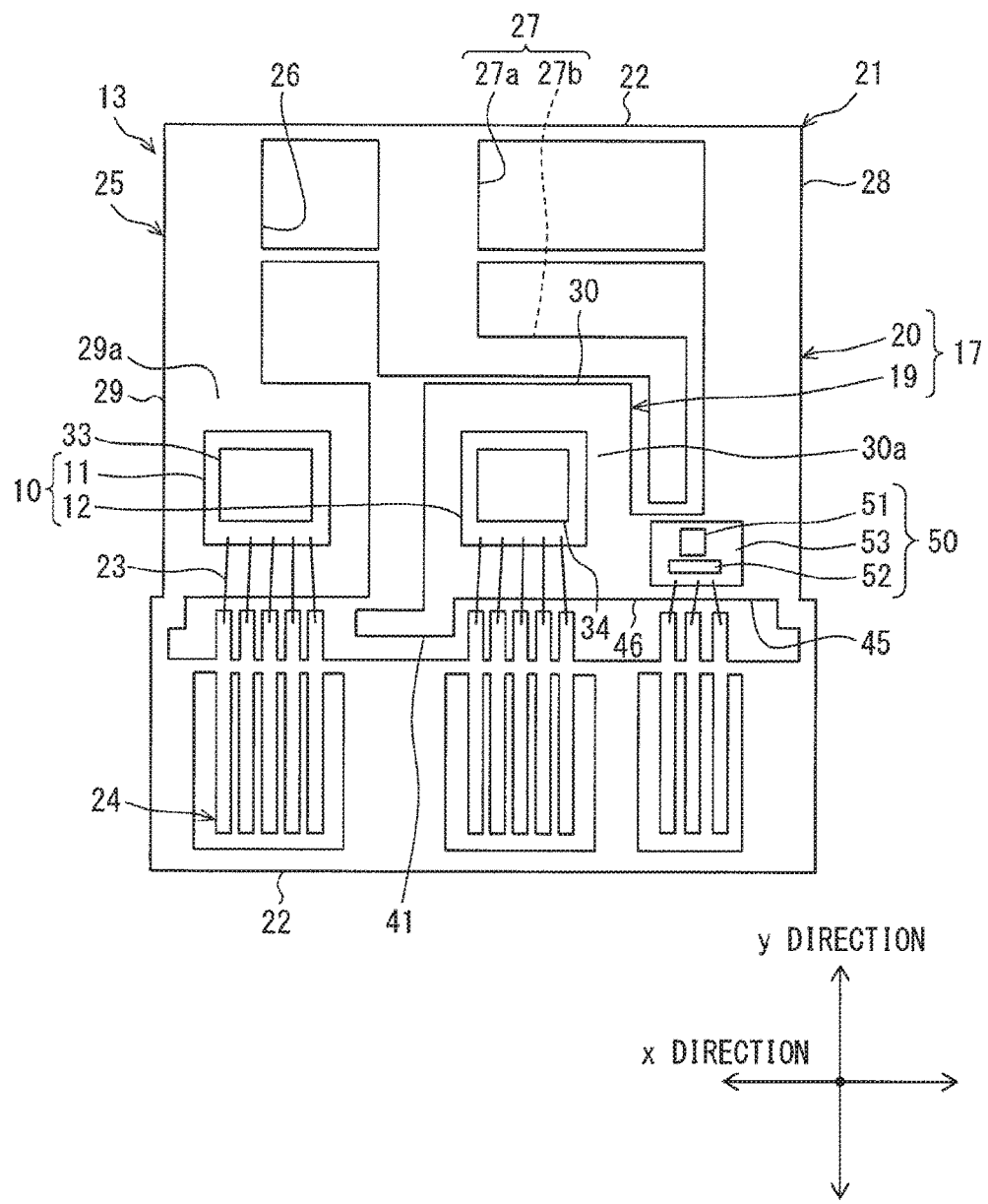
FIG. 4 is a top view illustrating a state of a lead frame on which power elements and a current sensor are mounted.
Figure 6:
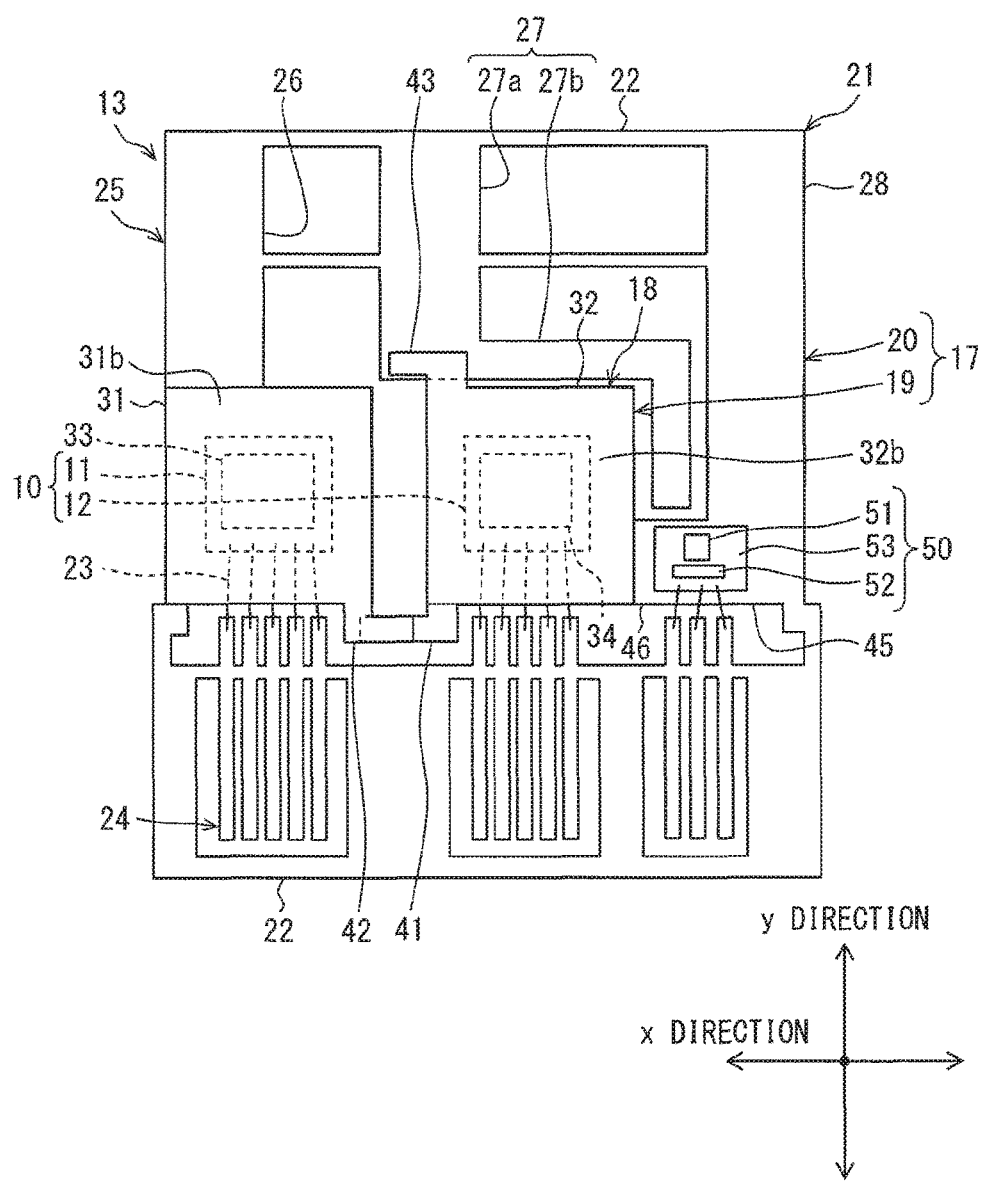
FIG. 6 is a top view illustrating a state of the second conductive plate mounted on the power elements.

The conductive plate 13 includes a lower plate 17 and an upper plate 18. The lower plate 17 includes a carrying portion 19 on which the power elements 11, 12 and the current detection portion 50 are carried, and a terminal portion 20 exposed through the covering portion 14 to the outside and electrically connected with the three-phase motor 200 and the controller 300 described above. The lower plate 17 is formed by removing a connection portion 22 from a lead frame 21 illustrated in FIGS. 4 and 6. The connection portion 22 is a portion for connecting the carrying portion 19 and the terminal portion 20. The removal of the connection portion 22 is completed by the following steps. Initially, the power elements 11, 12, the current detection portion 50, and blocks 33, 34 (described below) are fixed to the lead frame 21 to electrically connect with first terminals 24 (described below) via wires 23 as illustrated in FIG. 4. After fixation of the components, the upper plate 18 is fixed to the blocks 33, 34 as illustrated in FIG. 6. Thereafter, the lead frame 21 on which the blocks 33, 34, the power elements 11, 12, and the current detection portion 50 are carried, and a shield 90 (described below) are covered by the covering portion 14 to be connected into one piece body as illustrated in FIG. 3. After the connection, the connection portion 22 is removed to separate the carrying portion 19 from the terminal portion 20. Formation of the lower plate 17 illustrated in FIGS. 2 and 3, and manufacture of the power card 10 are now completed by the foregoing steps. Detailed configurations of the carrying portion 19 and the upper plate 18 will be described below.

The terminal portion 20 includes the multiple first terminals 24 electrically connected with the controller 300, and multiple second terminals 25 each of which has a larger area than each area of the first terminals 24, and lower resistance than each resistance of the first terminals 24. As illustrated in FIG. 2, an end of each of the first terminals 24 on the power element 11 side or the power element 12 side is connected with the wire 23, and covered by the covering portion 14. An opposite end of each of the first terminals 24 is exposed to the outside through the covering portion 14. The ends of the first terminals 24 on the side exposed to the outside are electrically connected with the controller 300.

Each of the second terminals 25 includes a power source terminal 26 connected with the power source, a ground terminal 27 connected with the ground, and an output terminal 28 connected with the three-phase motor 200. The power source terminal 26 is connected with a first carrying portion 29 (described below) into one piece body as illustrated in FIG. 4, while the ground terminal 27 is electrically connected with a fourth carrying portion 32 (described below) via a conductive member (not shown) as illustrated in FIG. 6. The ground terminal 27 according to this embodiment includes an external terminal 27a electrically connected with the ground, and an L-shaped extension portion 27b extending from the external terminal 27a toward the current detection portion 50. As illustrated in FIG. 2, the extension portion 27b and the shield 90 (described below) are electrically connected via a wire 93. The shield 90 is connected with the ground. As illustrated in FIG. 4, the output terminal 28 is connected with a second carrying portion 30 (described below) into one piece body. This configuration will be detailed below.

The current detection portion 50 detects a current input to or output from the power card 10 (a current of the output terminal 28) on the basis of a magnetic field generated by a flow of a current input to the power card 10 (power elements 11, 12), and output from the power card 10. The current detection portion 50 includes a magneto-electric conversion unit 51 converting a magnetic field into an electric signal, and a calculation unit 52 calculating a current of the power card 10 on the basis of the electric signal output from the magneto-electric conversion unit 51. According to this embodiment, the magneto-electric conversion unit 51 and the calculation unit 52 are mounted on a wiring board 53, and electrically connected with each other via the wiring board 53. As illustrated in FIG. 3, the current detection portion 50 is fixed to the output terminal 28 to allow permeation of a magnetic field generated by a flow of a current of the output terminal 28 into the current detection portion 50. While not depicted in the figures, the magneto-electric conversion unit 51 according to this embodiment is a bridge circuit configured by multiple magneto-resistive effect elements. Examples of the magneto-resistive effect elements adoptable herein include giant magneto-resistive effect elements, and tunneling magneto-resistive effect elements. The magneto-resistive effect elements exhibit properties of detecting a magnetic field extending in a direction perpendicular to the z direction (magnetic field along x-y plane described below), and not detecting a magnetic field extending in the z direction. The current detection portion 50 according to this embodiment includes a bias magnet 54 that applies a bias magnetic field to determine an initial value of the foregoing magneto-resistive effect elements. The bias magnet 54 is provided on the rear side of the carrying surface of the output terminal 28 on which the wiring board 53 is carried as illustrated in FIG. 3.

The semiconductor device 100 according to this embodiment further includes the shield 90 that prevents permeation of electromagnetic noise output from the power elements 11, 12 into the current detection portion 50, in addition to the power card 10 and the current detection portion 50 described above. The shield 90 includes flat shield portions 91, 92 each of which is connected with the ground. A flat shield portion may be referred to as a flat plate like shied portion. As illustrated in FIG. 3, each main surface (maximum area surface) of the shield portions 91, 92 crosses the z direction at right angles. A part of the output terminal 28 and the current detection portion 50 are disposed between the shield portions 91, 92. The shield portions 91, 92, and the lead frame 21 illustrated in FIG. 6 are disposed within a metal mold provided for molding the covering portion 14, and are covered by resin material configuring the covering portion 14. Needless to say, the shield portions 91, 92 are electrically connected with the ground terminal 27 via the wire 93 before covered by the foregoing resin material. The relative positions of the shield portions 91, 92 and the ground terminal 27 are fixed by a not-shown jig, for example. Connection of the wire 93 is made in this fixing condition. The configurations of the shield portions 91, 92, and of the current detection portion 50 provided on the output terminal 28 will be detailed below.

The detailed structure of the carrying portion 19 and the upper plate 18 will be hereinafter described. In the following description, a plane defined by the x direction and the y direction is referred to as the x-y plane, a plane defined by the y direction and the z direction is referred to as a y-z plane, and a plane defined by the z direction and the x direction is referred to as a z-x plane. First to third planes P1 to P3 are three parallel planes extending along the x-y plane. The first to third planes P1 to P3 are disposed at positions different from each other in the z direction. The third plane P3 is located between the first plane P1 and the second plane P2. In FIG. 3, the first plane P1 is indicated by a broken line, the second plane P2 is indicated by a long dashed short dashed line, and the third plane P3 is indicated by a long dashed and double-short dashed line. The distance between the first plane P1 and the second plan P2 in the z direction corresponds to a length (thickness) of the power card 10 (semiconductor device 100) in the z direction according to this embodiment.

As illustrated in FIG. 3, the carrying portion 19 includes a first carrying portion 29 to which a collector electrode of the first power element 11 (corresponding to first end of first power element) is electrically and mechanically connected, and a second carrying portion 30 to which a collector electrode of the second power element 12 (corresponding to first end of second power element) is electrically and mechanically connected. In other words, the first carrying portion 29 is electrically and mechanically connected to a collector electrode of the first power element 11, and the second carrying portion 30 is electrically and mechanically connected with a collector electrode of the second power element 12. The upper plate 18 includes a third carrying portion 31 to which an emitter electrode of the first power element 11 (corresponding to second end of first power element) is electrically and mechanically connected, and a fourth carrying portion 32 to which an emitter electrode of the second power element 12 (corresponding to second end of second power element) is electrically and mechanically connected. In other words, the third carrying portion 31 is electrically and mechanically connected with an emitter electrode of the first power element 11, and the fourth carrying portion 32 is electrically and mechanically connected with an emitter electrode of the second power element 12. The carrying portions 29, 30 are positioned in the first plane P1, while the carrying portions 31, 32 are positioned in the second plane P2. The power elements 11, 12 are positioned in the third plane P3. Assuming that k is a natural number ranging from 1 to 3, a state in which an object is positioned in a k-th plane Pk refers to such a state that the center of gravity of the object passes through the k-th plane Pk, or a surface of the object extends along the k-th plane Pk.

The conductive plate 13 further includes the conductive blocks 33, 34 in addition to the plates 17, 18 described above. The conductive blocks 33, 34 separate the power elements 11, 12 from the carrying portions 31, 32 in the z direction, respectively, for allowing connection of the wires 23 to the power elements 11, 12. As illustrated in FIG. 3, the collector electrode of the first power element 11 is connected with the first carrying portion 29 via a first conductive member 35 made of solder, for example, while the first block 33 is connected with the emitter electrode of the first power element 11 via a second conductive member 36. Furthermore, the first block 33 is connected with the third carrying portion 31 via a third conductive member 37. According to this structure, the first carrying portion 29 has the same potential as the potential of the collector electrode of the first power element 11, while the third carrying portion 31 has the same potential as the potential of the emitter electrode of the first power element 11. A carrying surface 29a of the first carrying portion 29 on which the first power element 11 is carried via the first conductive member 35 is covered by the covering portion 14, while a rear surface 29b on the opposite side is exposed through the covering portion 14. Similarly, a carrying surface 31a of the third carrying portion 31 on which the first power element 11 is carried via the conductive members 36, 37 and the first block 33 is covered by the covering portion 14, while a rear surface 31b on the opposite side is exposed through the covering portion 14. Accordingly, the rear surfaces 29b and 31b of the carrying portions 29, 31 electrically connected with the collector electrode and the emitter electrode of the first power element 11, respectively, are exposed through the covering portion 14 to constitute a both-side heat radiation structure. The rear surface 29b extends along the first plane P1, while the rear surface 31b extends along the third plane P3.

The second power element 12 has a configuration similar to the configuration of the first power element 11. More specifically, the collector electrode of the second power element 12 is connected with the second carrying portion 30 via a fourth conductive member 38, while the second block 34 is connected with the emitter electrode of the second power element 12 via a fifth conductive member 39. Furthermore, the second block 34 is connected with the fourth carrying portion 32 via a sixth conductive member 40. According to this structure, the second carrying portion 30 has the same potential as the potential of the collector electrode of the second power element 12, while the fourth carrying portion 32 has the same potential as the potential of the emitter electrode of the second power element 12. A carrying surface 30a of the second carrying portion 30 on which the second power element 12 is carried via the fourth conductive member 38 is covered by the covering portion 14. while a rear surface 30b on the opposite side is exposed through the covering portion 14. Similarly, a carrying surface 32a of the fourth carrying portion 32 on which the second power element 12 is carried via the conductive members 39, 40 and the second block 34 is covered by the covering portion 14, while a rear surface 32b on the opposite side is exposed through the covering portion 14. Accordingly, the rear surfaces 30b and 32b of the carrying portions 30, 32 electrically connected with the collector electrode and the emitter electrode of the second power element 12, respectively, are exposed through the covering portion 14 to constitute a both-side heat radiation structure. The rear surface 30b extends along the first plane P1, while the rear surface 32b extends along the third plane P3.

Figure 5:
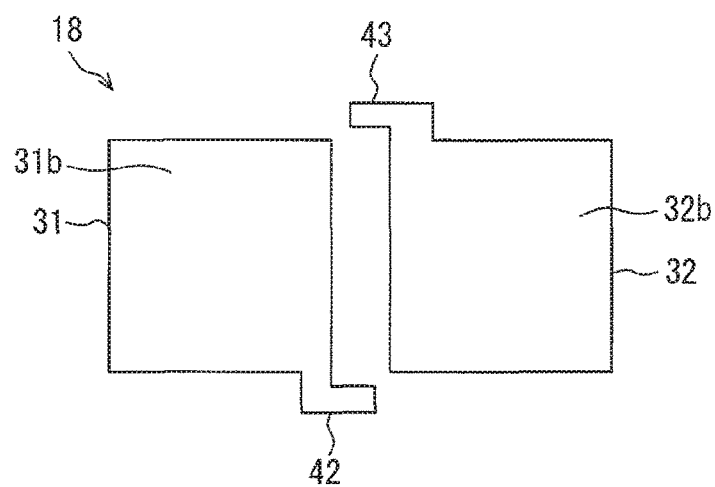
FIG. 5 is a top view illustrating a second conductive plate.
Figure 5:
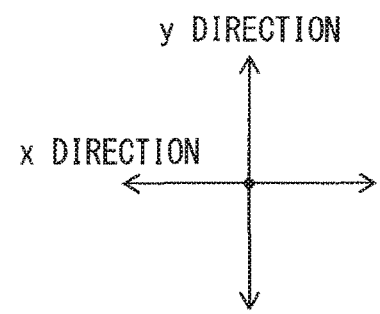

As illustrated in FIG. 4, the carrying portion 19 includes a first lower arm portion 41 for electrically connecting the second carrying portion 30 and the third carrying portion 31, in addition to the foregoing carrying portions 29, 30. As illustrated in FIG. 5, the upper plate 18 includes a first upper arm portion 42 for electrically connecting the second carrying portion 30 and the third carrying portion 31, and a second upper arm portion 43 for electrically connecting the fourth carrying portion 32 and the ground terminal 27, in addition to the foregoing carrying portions 31, 32. As illustrated in FIG. 3, the first lower arm portion 41 is configured to extend from the second carrying portion 30 toward the third carrying portion 31 while crossing the third plane P3, and electrically connect with the first upper arm portion 42 via a seventh conductive member 44. This structure makes series connection between the first power element 11 and the second power element 12. The first lower arm portion 41, the first upper arm portion 42, and the seventh conductive member 44 described above correspond to a first connection portion. On the other hand, the second upper arm portion 43 is configured to extend from the fourth carrying portion 32 toward the ground terminal 27 while crossing the third plane P3, and electrically connect with the ground terminal 27 via a conductive member (not shown). This structure makes connection between the emitter electrode of the second power element 12 and the ground.

The output terminal 28 will be hereinafter described. As illustrated in FIGS. 2 and 3, the first power element 11 fixed to the carrying portions 29, 31, the second power element 12 fixed to the carrying portions 30, 32, and the output terminal 28 are sequentially disposed in the x direction. The output terminal 28 includes a fifth carrying portion 45 on which the current detection portion 50 is carried, and a second lower arm portion 46 for connecting the fifth carrying portion 45 and the second carrying portion 30. As illustrated in FIGS. 2 and 4, the fifth carrying portion 45 has an L shape in the x-y plane. One end of the fifth carrying portion 45 is connected with the second carrying portion 30 via the second lower arm portion 46, while the other end is exposed to the outside through the covering portion 14. As illustrated in FIG. 3, the fifth carrying portion 45 on which the current detection portion 50 is carried is disposed between the first plane P1 and the second plane P2. The second lower arm portion 46 has a shape extending from the second carrying portion 30 toward the fifth carrying portion 45, and connects the carrying portions 30, 45 into one piece body. The second lower arm portion 46 corresponds to a second connection portion.

The configurations of the shield portions 91, 92, and the current detection portion 50 provided on the output terminal 28 will be hereinafter described. As illustrated in FIG. 3, the first shield portion 91 and the carrying portions 29, 30 are positioned in the first plane P1, while the second shield portion 92 and the carrying portions 31, 32 are positioned in the second plane P2. A main surface 91a and a main surface 92a face each other in the z direction via the covering portion 14, the current detection portion 50, and the fifth carrying portion 45. This structure changes the direction of an external magnetic field traveling along the x-y plane toward an area between the shield portions 91, 92 such that the external magnetic field is bended toward the shield portions 91, 92, while producing such a state that a magnetic field generated in the z-x plane by a flow of a current of the output terminal 28 (fifth carrying portion 45) in the y direction permeates the current detection portion 50. Accordingly, this structure reduces permeation of the external magnetic field traveling along the x-y plane into the current detection portion 50 disposed in the area between the shield portions 91, 92. However, the shield portions 91, 92 do not bend the track of an external magnetic field traveling in the z direction toward the area between the shield portions 91, 92. The external magnetic field traveling in the z direction therefore permeates the current detection portion 50. As described above, the current detection portion 50 has properties of detecting a magnetic field along the x-y plane, but not detecting a magnetic field in the z direction. Accordingly, detection accuracy for detecting a current flowing in the output terminal 28 does not lower even when the external magnetic field in the z direction permeates the current detection portion 50 via the shield portions 91, 92. When an external magnetic field traveling obliquely to the x-y plane reaches the shield portions 91, 92, the track of a z-direction component of the external magnetic field is not bended by the shield portions 91, 92, but the track of a component along the x-y plane is bended by the shield portions 91, 92. As illustrated in FIG. 3, rear surfaces 91b and 92b of the main surfaces 91a and 92a of the shield portions 91, 92 are exposed to the outside through the covering portion 14. Accordingly, the shield portions 91, 92 also perform a function of radiating heat generated from the power elements 11, 12. The rear surface 91b extends long the first plane P1, while the rear surface 92b extends along the third plane P3.

Effects of the semiconductor device 100 according to this embodiment will be hereinafter described. As described above, a current flows from the first power element 11 to the three-phase motor 200 as indicated by the solid arrow in FIG. 1 in the driving state of the first power element 11 and the non-driving state of the second power element 12. On the other hand, in a non-driving state of the first power element 11 and a driving state of the second power element 12, a current flows from the three-phase motor 200 to the second power element 12 as indicated by the broken arrow in FIG. 1. Accordingly, in the structure of series connection of the first power element 11 and the second power element 12 via the arm portions 41, 42 and the seventh conductive member 44 as described above, a current flows in the following manner in accordance with the driving states of the power elements 11, 12. In the driving state of the first power element 11 and the non-driving state of the second power element 12, a current flows from the first power element 11 to the output terminal 28 connected with the collector electrode of the second power element 12 via the arm portions 41, 42 and the seventh conductive member 44. On the other hand, in the state of the non-driving state of the first power element 11 and the driving state of the second power element 12, a current flows from the output terminal 28 to the second power element 12 without passing through the arm portions 41, 42 and the seventh conductive member 44. In this case, the current flowing in the arm portions 41, 42 and the seventh conductive member 44 does not correspond to the current input to and output from the two power elements 11, 12 (current input to and output from power card 10). According to a structure that fixes the current detection portion to the arm portions connecting the two power elements in series, a magnetic field generated by a flow of a current of the arm portions 41, 42 permeates the current detection portion 50. In this condition, the current input to and output from the power card 10 is difficult to detect. On the other hand, according to the semiconductor device 100 of the present disclosure, since the current detection portion 50 is fixed to the output terminal 28 as described above, a magnetic field generated by a flow of a current of the output terminal 28 permeates the current detection portion 50. In this structure, the current input to and output from the power card 10 is detectable by using the current detection portion 50.

The current detection portion 50 is positioned between the first plane P1 and the second plane P2. This structure reduces increase in the size of the semiconductor device 100 in comparison with a structure that includes a current detection portion disposed outside a space between a first plane and a second plane.

The first power element 11 to which the carrying portions 29, 31 are fixed, the second power element 12 to which the carrying portions 30, 32 are fixed, and the output terminal 28 are sequentially disposed in the x direction. According to this structure, the output terminal 28 to which the current detection portion 50 is fixed is located in an area out of a facing area between the first carrying portion 29 and the third carrying portion 31, and a facing area between the second carrying portion 30 and the fourth carrying portion 32. In this case, each of the distance between the carrying portions 29, 31, and the distance between the carrying portions 30, 32 (thickness of semiconductor device 100) is independent from the current detection portion 50 and the output terminal 28, unlike a structure in which the output terminal to which the current detection portion is fixed is located between the first carrying portion and the third carrying portion, or between the second carrying portion or the fourth carrying portion. Accordingly, the thickness of the semiconductor device 100 does not increase.

The first shield portion 91 and the carrying portions 29, 30 are positioned in the first plane P1, while the second shield portion 92 and the carrying portions 31, 32 are positioned in the second plane P2. According to this structure, the size of the semiconductor device 100 does not increase in comparison with a structure in which shield portions positions outside the space between the first plane and the second plane.

The present disclosure is not limited to the embodiment described herein in any way. Various modifications may be made without departing from the scope of the present disclosure.

According to this embodiment, the semiconductor device 100 includes the three power cards 10. However, the semiconductor device 100 is only required to include at least one of the three power cards 10 configuring an inverter. Accordingly, a single body of the semiconductor device 100 is not required to constitute an overall invader, but may be a device configuring only a part of the inverter.

According to this embodiment, the one power card 10 includes the two power elements 11, 12. However, the power card 10 may include three pairs of the two power elements 11, 12. In case of this structure, the three pairs of power elements 11, 12, and the conductive plates 13 that are respectively provided for the three pairs of power elements 11, 12 are connected into one piece body by the common single covering portion 14.

According to this embodiment, each of the power elements 11, 12 is configured by the IGBT. However, each of the power elements 11, 12 is not limited to this example, but may be MOSFET.

Figure 7:
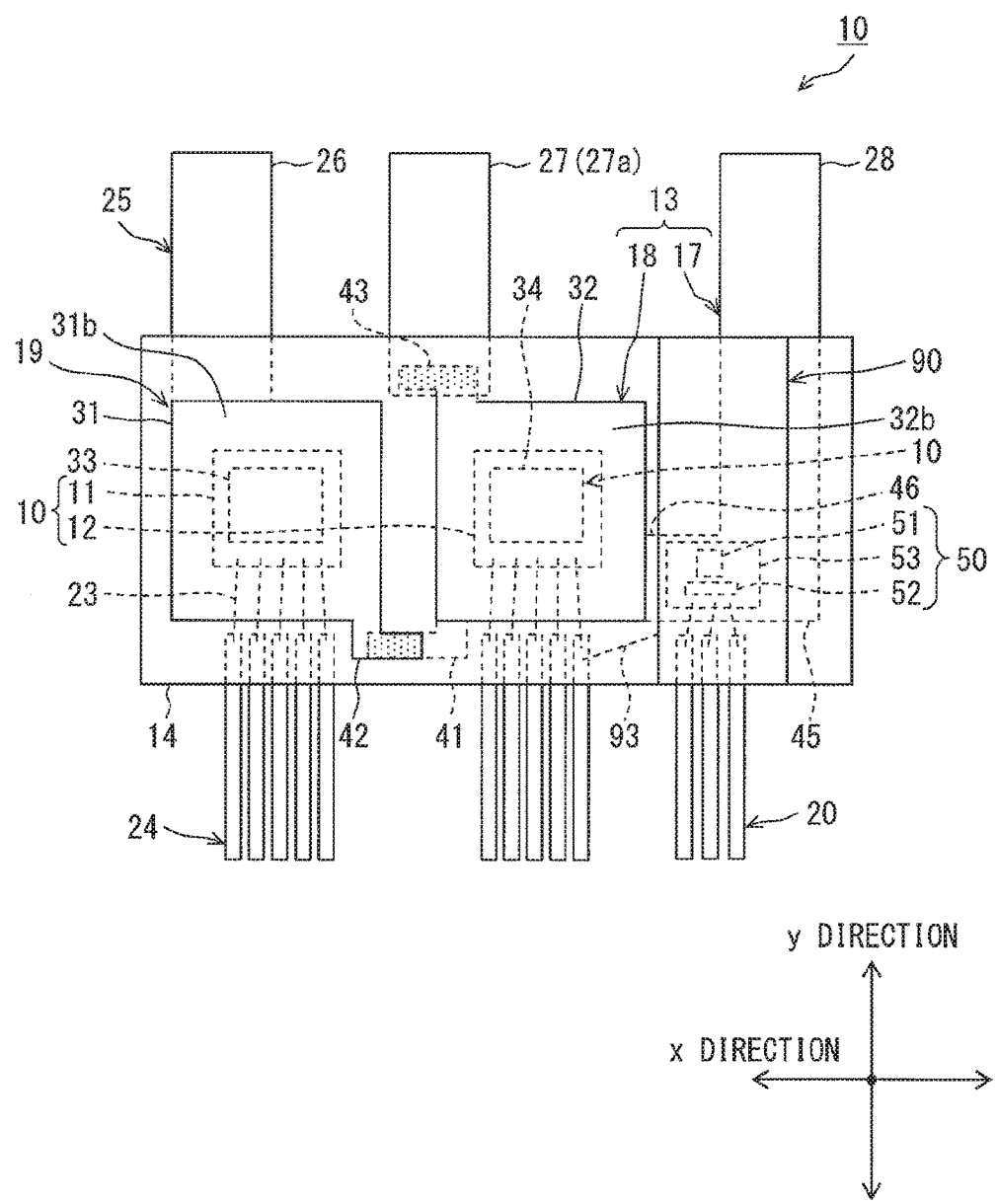
FIG. 7 is a top view illustrating a modification of the semiconductor device.

According to this embodiment, the ground terminal 27 includes the external terminal 27a and the extension portion 27b. However, the extension portion 27b may be eliminated from the ground terminal 27 as illustrated in FIG. 7. In this case, the shield 90 is electrically connected with the first terminal 24 via the wire 93, which terminal 24 corresponds to the one first terminal 24 included in the multiple first terminals 24 and fixed to the ground potential. Alternatively, a part (not shown) of the second shield portion 92 may constitute one of the multiple first terminals 24, and connect with the ground. In this case, the first shield portion 91 and the second shield portion 92 may be provided as a one piece body combined with each other. In case of this structure, the shield portions 91, 92 are made of material having different magnetism from that of the material of the lead frame 21 made of copper or other metal material having high heat conductivity. For example, the shield portions 91, 92 are made of iron or permalloy.

Figure 8:
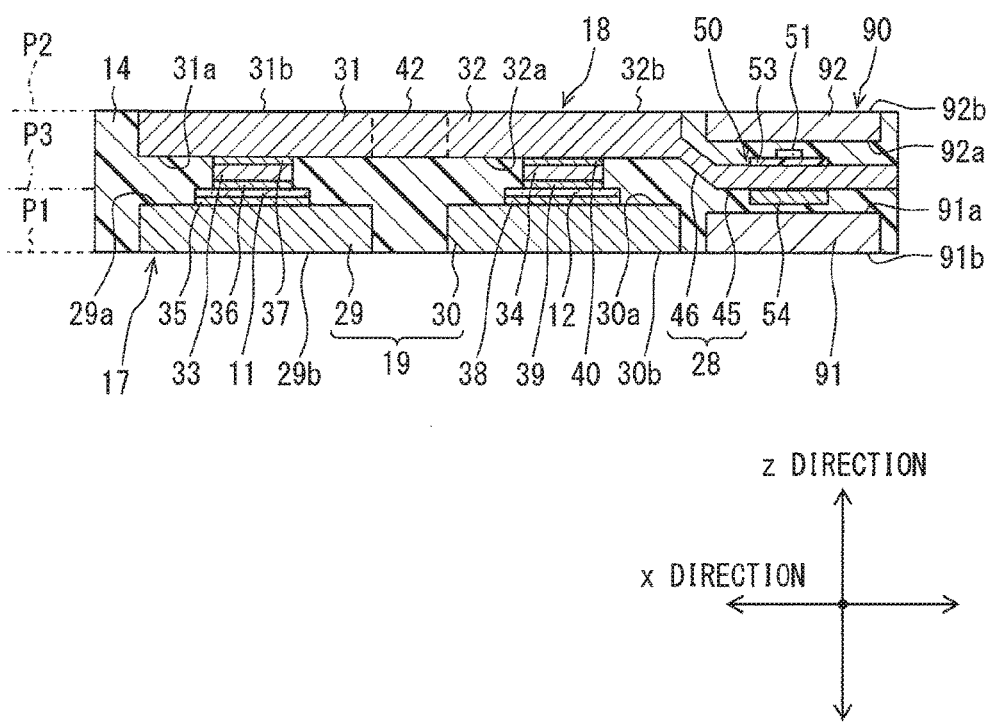
FIG. 8 is a sectional view illustrating a modification of the semiconductor device.

According to this embodiment, the collector electrode of the second power element 12 is connected with the second carrying portion 30, while the emitter electrode of the second power element 12 is connected with the fourth carrying portion 32. The first lower arm portion 41 extends from the second carrying portion 30 toward the third carrying portion 31 while crossing the third plane P3 to electrically connect with the first upper arm portion 42 via the seventh conductive member 44. However, a configuration illustrated in FIG. 8 may be adopted when connection is made between the emitter electrode of the second power element 12 and the second carrying portion 30, and between the collector electrode of the second power element 12 and the fourth carrying portion. More specifically, the third carrying portion 31 and the fourth carrying portion 32 may be connected into one piece body via the first upper arm portion 42 extending along the second plane P2 to make series connection between the first power element 11 and the second power element 12. This modification eliminates the necessity of the first lower arm portion 41 and the seventh conductive member 44. The first upper arm portion 42 corresponds to the first connection portion. The second carrying portion 30 illustrated in FIG. 8 corresponds to the fourth carrying portion, while the third carrying portion 31 illustrated in FIG. 8 corresponds to the second carrying portion. The fourth carrying portion 32 corresponds to the third carrying portion. In FIG. 8, the boundary between the carrying portions 30, 32 and the first upper arm portion 42 is indicated by broken lines to clarify the configuration.

Figure 9:
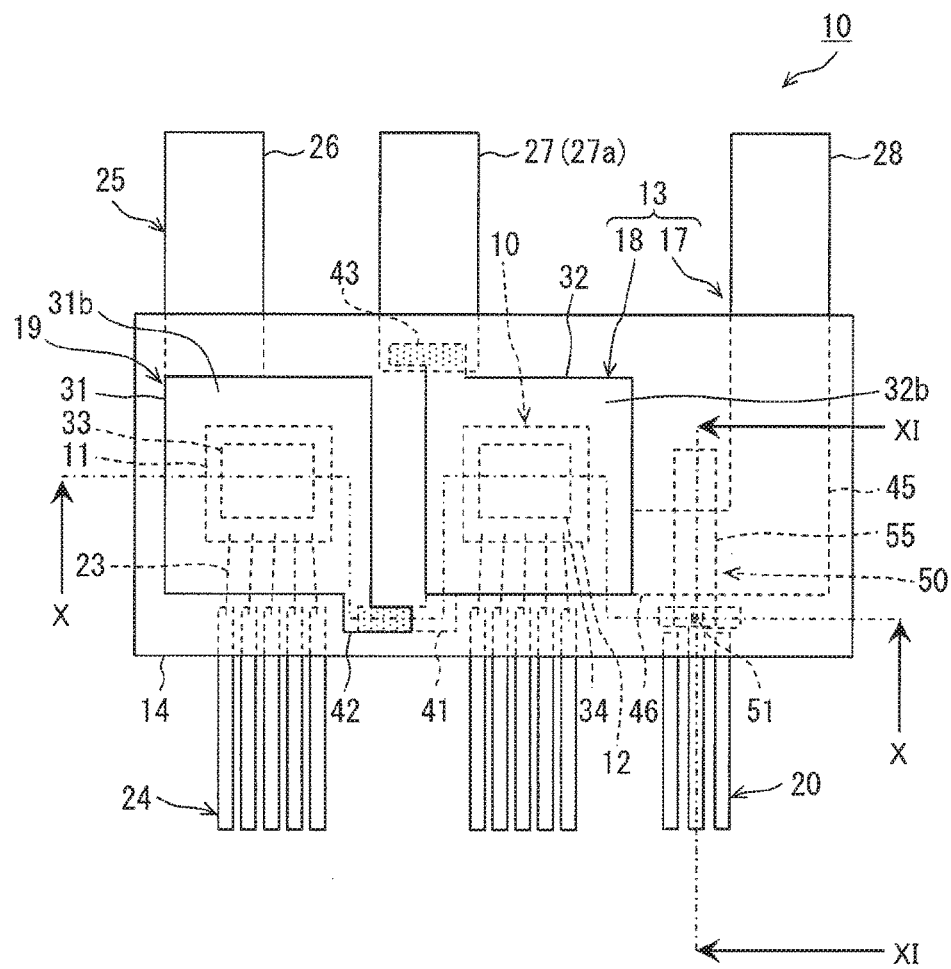
FIG. 9 is a top view illustrating a modification of the semiconductor device.
Figure 9:
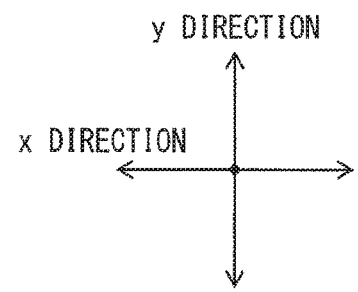
Figure 10:
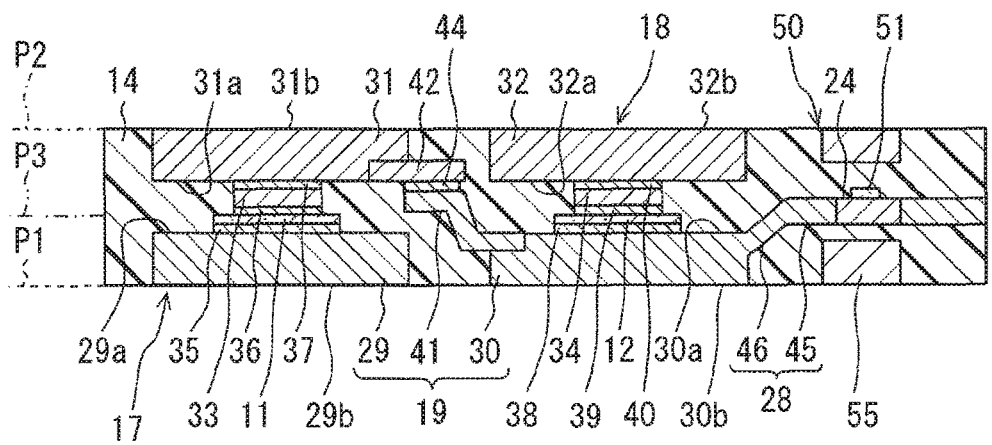
FIG. 10 is a sectional view taken along line X-X in FIG. 9.
Figure 10:
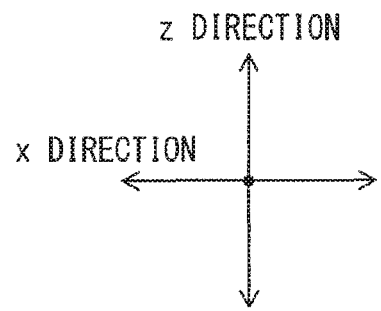
Figure 11:
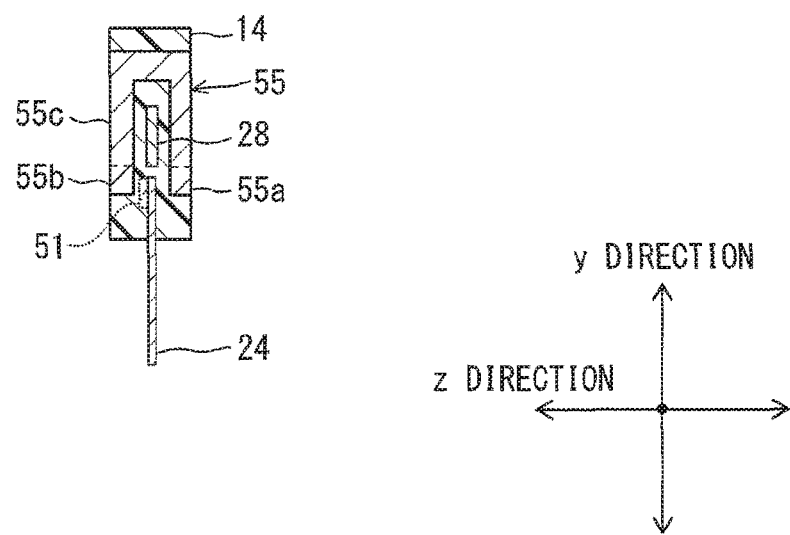
FIG. 11 is a sectional view taken along line XI-XI in FIG. 9.

According to this embodiment, the magneto-electric conversion unit 51 is a bridge circuit constituted by the multiple magneto-resistive effect elements. However, the magneto-electric conversion unit 51 is not limited to this example, but may be a Hall device. In this case, the current detection portion 50 includes a magnetic collection core 55 that collects a magnetic field generated by a flow of a current of the output terminal 28 and causes the collected magnetic field to permeate the magneto-electric conversion unit 51 (Hall device) as illustrated in FIGS. 9 to 11. The magneto-electric conversion unit 51 is carried on one of the multiple first terminals 24. The magnetic collection core 55 has an annular shape including a gap to surround the output terminal 28. The magneto-electric conversion unit 51 is disposed between two ends 55a and 55b forming the gap. According to this structure, a magnetic field generated by a flow of a current of the output terminal 28 is collected by the magnetic collection core 55. The collected magnetic field permeates the magneto-electric conversion unit 51. The ends 55a and 55b are portions of the magnetic collection core 55 located on the side ranging from the output terminal 28 to the first terminal 24. The other portion constitutes a main body portion 55c having an annular shape to surround the output terminal 28. In FIG. 11, the boundary between the ends 55a and 55b and the main body portion 55c is indicated by a broken line.

The calculation unit 52 may be either provided on, or eliminated from the magneto-electric conversion unit 51 as in the structure illustrated in FIGS. 9 to 11. Moreover, the shield 90 may be either provided on, or eliminated from the semiconductor device 100 as in the structure illustrated in FIGS. 9 to 11. When the semiconductor device 100 is equipped with the shield 90, the magneto-electric conversion unit 51 and the magnetic collection core 55 are disposed between the shield portions 91, 92.

According to this embodiment, the shield 90 is included in the semiconductor device 100. However, the shield 90 may be eliminated from the semiconductor device 100.

According to this embodiment, the shield 90 includes the flat shield portions 91, 92, However, the shape of each of the shield portions 91, 92 is not limited to the foregoing example, but may be a shape surrounding the circumference of the output terminal 28, for example. In this case, the shield 90 is only required to include at least either one of the shield portions 91, 92. In this case, the shield 90 may have an annular shape including a gap, for example.

According to this embodiment, each of the rear surfaces 91b and 92b of the shield portions 91, 92 is exposed through the covering portion 14 to the outside. However, the entire surfaces of the shield portions 91, 92 may be covered by the covering portion 14.

Each of the first power element 11 and the second power element 12 is also referred to as a power element. Similarly, each of the upper plate 18 and the lower plate 17 is also referred to as a plate. Each of the first carrying portion 29, the second carrying portion 30, the third carrying portion 31, the fourth carrying portion 32, and the fifth carrying portion 45 is also referred to as a carrying portion. Each of the first block 33 and the second block 34 is also referred to as a block. Each of the first conductive member 35, the second conductive member 36, the third conductive member 37, the fourth conductive member 38, the fifth conductive member 39, the sixth conductive member 40, and the seventh conductive member 44 is also referred to as a conductive member. Each of the first lower arm portion 41, the first upper arm portion 42, the second upper arm portion 43, and the second lower arm portion 46 is also referred to as an arm portion. Each of the first shield portion 91 and the second shield portion 92 is also referred to as a shield portion.

While embodiments, configurations, and aspects of the semiconductor apparatus of one mode of the present disclosure have been exemplified, the embodiments, configurations, and aspects of the present disclosure are not limited to those described above. For example, embodiments, configurations, and aspects obtained from an appropriate combination of technical elements disclosed in different embodiments, configurations, and aspects are also included within the scope of the embodiments, configurations, and aspects of the present disclosure.

The invention claimed is:

1. A semiconductor device comprising:
a plurality of power elements that configures an inverter;
a conductive plate that electrically connects the plurality of power elements; and
a current detection portion that detects a current of the plurality of power elements based on a magnetic field generated by a flow of a current input to the plurality of power elements and a current output from the plurality of power elements,
wherein:
the plurality of power elements at least include a first power element and a second power element;
the conductive plate includes:
a first carrying portion to which a first end of the first power element is connected;
a second carrying portion to which a first end of the second power element is connected;
a third carrying portion to which a second end of the first power element is connected;
a fourth carrying portion to which a second end of the second power element is connected;
a first connection portion that electrically connects the second carrying portion and the third carrying portion to connect the first power element and the second power element in series; and
an output terminal electrically connected with the second carrying portion or the third carrying portion;
the first carrying portion is connected with a first power source and the fourth carrying portion is connected with a second power source; and the current detection portion is fixed to the output terminal and the magnetic field generated by the flow of the current of the output terminal permeates the current detection portion, wherein when three planes in parallel with each other are defined as a first plane, a second plane, and a third plane, and also when the third plane is located between the first plane and the second plane, the first carrying portion and the second carrying portion are positioned in the first plane;

the third carrying portion and the fourth carrying portion are positioned in the second plane;

the first power element and the second power element are positioned in the third plane; and the first connection portion extends from the second carrying portion to the third carrying portion while crossing the third plane, wherein the current detection portion is positioned between the first plane and the second plane, the output terminal includes a fifth carrying portion to which the current detection portion is fixed, and a second connection portion that connects the second carrying portion or the third carrying portion with the fifth carrying portion; and the fifth carrying portion is positioned in an area out of a facing area between the first carrying portion and the third carrying portion, and a facing area between the second carrying portion and the fourth carrying portion, the semiconductor device further comprising:

a shield that prevents a permeation of an electromagnetic noise into the current detection portion, the electromagnetic noise being output from the first power element and the second power element, wherein:

the shield includes a flat first shield portion positioned in the first plane, and a flat second shield portion positioned in the second plane, the first shield portion and the second shield portion both being connected with a ground; and a main surface of the first shield portion and a main surface of the second shield portion face each other via the current detection portion and the fifth carrying portion.

2. The semiconductor device according to claim 1, further comprising:

a magnetic collection core that collects a magnetic field generated by the flow of the current of the output terminal, wherein:

the magnetic field of the output terminal collected by the magnetic collection core permeates the current detection portion.

3. The semiconductor device according to claim 1, wherein:

the current detection portion includes a magneto-electric conversion unit that converts a magnetic field into an electric signal, and a calculation unit that calculates a current of the first power element and the second power element based on the electric signal output from the magneto-electric conversion element.

4. A semiconductor device comprising:

a plurality of power elements that configures an inverter;

a conductive plate that electrically connects the plurality of power elements; and a current detection portion that detects a current of the plurality of power elements based on a magnetic field generated by a flow of a current input to the plurality of power elements and a current output from the plurality of power elements, wherein:

the plurality of power elements at least include a first power element and a second power element;

the conductive plate includes:

a first carrying portion to which a first end of the first power element is connected;

a second carrying portion to which a first end of the second power element is connected;

a third carrying portion to which a second end of the first power element is connected;

a fourth carrying portion to which a second end of the second power element is connected;

a first connection portion that electrically connects the second carrying portion and the third carrying portion to connect the first power element and the second power element in series; and an output terminal electrically connected with the second carrying portion or the third carrying portion;

the first carrying portion is connected with a first power source and the fourth carrying portion is connected with a second power source; and the current detection portion is fixed to the output terminal and the magnetic field generated by the flow of the current of the output terminal permeates the current detection portion, wherein when three planes in parallel with each other are defined as a first plane, a second plane, and a third plane, and also when the third plane is located between the first plane and the second plane, the first carrying portion and the fourth carrying portion are positioned in the first plane;

the second carrying portion and the third carrying portion are positioned in the second plane;

the first power element and the second power element are positioned in the third plane; and the first connection portion extends from the second carrying portion to the third carrying portion along the second plane, wherein the current detection portion is positioned between the first plane and the second plane, the output terminal includes a fifth carrying portion to which the current detection portion is fixed, and a second connection portion that connects the second carrying portion or the third carrying portion with the fifth carrying portion; and the fifth carrying portion is positioned in an area out of a facing area between the first carrying portion and the third carrying portion, and a facing area between the second carrying portion and the fourth carrying portion, the semiconductor device further comprising:

a shield that prevents a permeation of an electromagnetic noise into the current detection portion, the electromagnetic noise being output from the first power element and the second power element, wherein:

the shield includes a flat first shield portion positioned in the first plane, and a flat second shield portion positioned in the second plane, the first shield portion and the second shield portion both being connected with a ground; and a main surface of the first shield portion and a main surface of the second shield portion face each other via the current detection portion and the fifth carrying portion.

5. A semiconductor device comprising:
a plurality of power elements that configures an inverter;
a conductive plate that electrically connects the plurality of power elements; and
a current detection portion that detects a current of the plurality of power elements based on a magnetic field generated by a flow of a current input to the plurality of power elements and a current output from the plurality of power elements,
wherein:
the plurality of power elements at least include a first power element and a second power element;
the conductive plate includes:
  a first carrying portion to which a first end of the first power element is connected;
  a second carrying portion to which a first end of the second power element is connected;
  a third carrying portion to which a second end of the first power element is connected;
  a fourth carrying portion to which a second end of the second power element is connected;
  a first connection portion that electrically connects the second carrying portion and the third carrying portion to connect the first power element and the second power element in series; and
  an output terminal electrically connected with the second carrying portion or the third carrying portion;
the first carrying portion is connected with a first power source and the fourth carrying portion is connected with a second power source; and
the current detection portion is fixed to the output terminal and the magnetic field generated by the flow of the current of the output terminal permeates the current detection portion, wherein
the output terminal includes a fifth carrying portion to which the current detection portion is fixed, and a second connection portion that connects the second carrying portion or the third carrying portion with the fifth carrying portion; and
the fifth carrying portion is positioned in an area out of a facing area between the first carrying portion and the third carrying portion, and a facing area between the second carrying portion and the fourth carrying portion,
the semiconductor device further comprising:
a shield that prevents a permeation of an electromagnetic noise into the current detection portion, the electromagnetic noise being output from the first power element and the second power element,
wherein:
the shield includes a flat first shield portion positioned in the first plane, and a flat second shield portion positioned in the second plane, the first shield portion and the second shield portion both being connected with a ground; and
a main surface of the first shield portion and a main surface of the second shield portion face each other via the current detection portion and the fifth carrying portion.

* * * * *